(12) United States Patent
Gourlat et al.

(10) Patent No.: US 9,515,608 B2
(45) Date of Patent: Dec. 6, 2016

(54) MULTIMODE OSCILLATOR ENABLING SIMULTANEOUS MONITORING OF VARIATIONS IN SEVERAL RESONANCE FREQUENCIES OF A RESONATOR

(71) Applicant: Commissariat A L'Energie Atomique et aux Energies Alternatives, Paris (FR)

(72) Inventors: Guillaume Gourlat, Grenoble (FR); Gerard Billiot, St Nazaire les Eymes (FR); Patrick Villard, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/976,767

(22) Filed: Dec. 21, 2015

(65) Prior Publication Data

US 2016/0181977 A1    Jun. 23, 2016

(30) Foreign Application Priority Data

Dec. 22, 2014  (FR) ...................... 14 63107

(51) Int. Cl.
*H03B 5/30* (2006.01)
*H03B 5/32* (2006.01)
*H03B 25/00* (2006.01)

(52) U.S. Cl.
CPC ............... *H03B 5/323* (2013.01); *H03B 5/30* (2013.01); *H03B 25/00* (2013.01)

(58) Field of Classification Search
CPC .................... H03B 5/30; H03B 5/323
See application file for complete search history.

(56) References Cited

U.S. PATENT DOCUMENTS

2009/0224850 A1* 9/2009 Nakamura ........... H03H 3/0076
                                                                    333/186
2013/0154440 A1   6/2013 Hentz
(Continued)

FOREIGN PATENT DOCUMENTS

| EP | 2 620 751 A1 | 7/2013 |
|---|---|---|
| FR | 2 964 651 A1 | 3/2012 |
| FR | 2 964 652 A1 | 3/2012 |
| FR | 2 964 653 A1 | 3/2012 |
| WO | WO 2014/064273 A1 | 5/2014 |

OTHER PUBLICATIONS

French Preliminary Search Report issued Oct. 12, 2015 in French Application 14 63107, filed on Dec. 22, 2014 (with English translation of Categories of Cited Documents).
(Continued)

*Primary Examiner* — Jeffrey Shin
(74) *Attorney, Agent, or Firm* — Oblon, McClelland, Maier & Neustadt, L.L.P.

(57) ABSTRACT

A multimode oscillator comprising:
  a resonator including:
    a moving element;
    actuators of the moving element according to two symmetric and antisymmetric resonance modes;
    several detectors of the displacement of the moving element;
  polarization circuitry of the detectors by signals out of phase with each other;
  a first calculator carrying out a first operation conserving the frequential components of the first mode and cancelling those of the second mode;
  a second calculator carrying out a second operation conserving the frequential components of the second mode and cancelling those of the first mode;
and in which the resonator and the calculators form two self-oscillating loops making the oscillator resonate simultaneously in the two modes.

15 Claims, 5 Drawing Sheets

(56) References Cited

U.S. PATENT DOCUMENTS

2013/0160550 A1    6/2013   Hentz
2013/0214644 A1    8/2013   Hentz et al.
2014/0176203 A1*   6/2014   Matheny ................. H03B 5/30
                                                          327/146
2014/0340102 A1*   11/2014  Glavic ..................... H02J 3/24
                                                          324/704

OTHER PUBLICATIONS

I Bargatin et al. "Efficient electrothermal actuation of multiple modes of high-frequency nanoelectromechanical resonators"., Applied Physics Letters 90, 2007, 3 pages.

Tomas Roubicek et al. "Digital Oscillator Circuit using Synchronous Pulse Driving", Electronics, Circuits and Systems, 2008, 4 pages.

M.S. Hanay et al. "Single-protein nanomechanical mass spectrometry in real time", Nature Nanotechnology, vol. 7, 2012, 7 pages.

E Mile et al. "In-Plane nanoelectromechanical resonators based on silicon nanowire piezoresistive detection", Nanotechnology, vol. 21, No. 16, 2010, 8 pages.

Gregory Arndt et al. "Towards Ultra-Dense Arrays of VHF NEMS with FDSOI-CMOS Active Pixels for Sensing Applications", Solid-State Circuits Conference Digest of technical papers (ISSCC), 2012, 3 pages.

G. Jourdan et al. "NEMS-based heterodyne self-oscillator", Sensors and Actuators, vol. 189, 2013, 7 pages.

* cited by examiner

MULTIMODE OSCILLATOR ENABLING SIMULTANEOUS MONITORING OF VARIATIONS IN SEVERAL RESONANCE FREQUENCIES OF A RESONATOR

TECHNICAL FIELD AND PRIOR ART

The invention relates to a multimode oscillator in which a resonator is able to resonate according to at least two resonance modes, one symmetric and the other antisymmetric, and enabling monitoring of variations in the resonance frequencies of the resonator. The invention also relates to a detection device comprising such multimode oscillators, for example for gas analysis or mass spectrometry.

Figure 1:
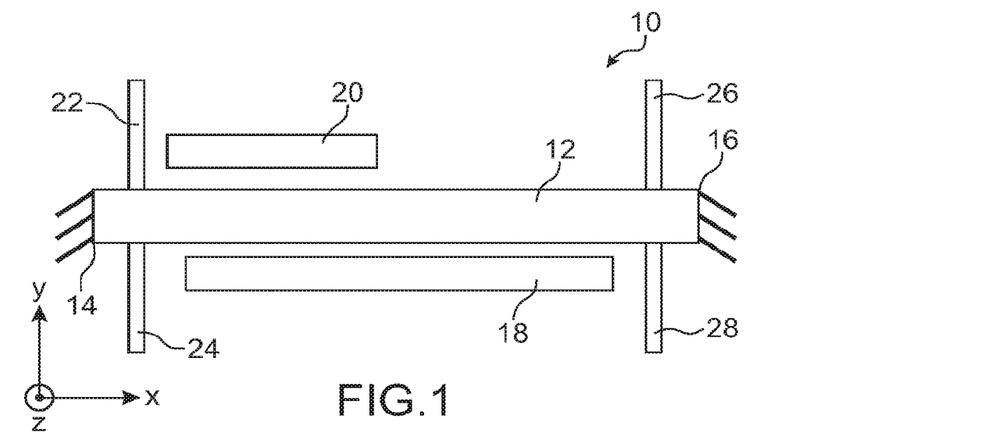
FIG. 1 shows a resonator with a doubly built-in beam.

FIG. 1 schematically shows a resonator 10, here a nano-resonator, which comprises a beam 12 (of nanometric dimensions in the case of a nano-resonator) forming the moving element of the resonator 10 and of which the ends 14, 16 are built-in (doubly built-in beam). The resonator 10 comprises actuating electrodes 18, 20 arranged parallel to the beam 12 and making it possible to make the beam 12 resonate in the plane in which the beam 12 and the electrodes 18, 20 (plane (X,Y) in FIG. 1) lie. The actuation of the beam 12 takes place through an electrostatic force induced by the electrodes 18, 20 on the beam 12.

The detection of displacement of the beam 12 is carried out by piezoresistive strain gauges 22, 24, 26, 28, each comprising one end mechanically coupled to the beam 12, and arranged perpendicularly to the beam 12 that is to say such that each of the gauges 22, 24, 26, 28 comprises its greatest dimension which extends along a direction (parallel to the Y axis) perpendicular to the largest dimension of the beam 12 (the beam 12 extending along a direction parallel to the X axis). Two first gauges 22, 24 are arranged on the side of the first end 14, on each side of the beam 12, and form a first piezoresistive strain gauge bridge coupled to the beam 12. Two second gauges 26, 28 are arranged on the side of the second end 16, also on each side of the beam 12, and form a second piezoresistive strain gauge bridge coupled to the beam 12. The gauges 22, 24, 26, 28 extend in the same plane (X,Y) as that in which the beam 12 vibrates. The distances between the first end 14 and the contact point of the beam 12 with the first gauge bridge, and between the second end 16 and the contact point of the beam 12 with the second gauge bridge, are chosen such that the strains induced by the movement of the beam 12 on the gauges 22, 24, 26, 28 are maximised and such that the gauges 22, 24, 26, 28 perturb the movement of the beam 12 as little as possible.

To carry out the monitoring of the evolution of the resonance frequency of the resonator 10, when said resonator is made to resonate in a single resonance mode, or bending mode, the resonator 10 may be arranged within a closed loop architecture making it possible to monitor this evolution of the resonance frequency of the resonator 10 while maximising its dynamic range and its frequential resolution.

Figure 2:
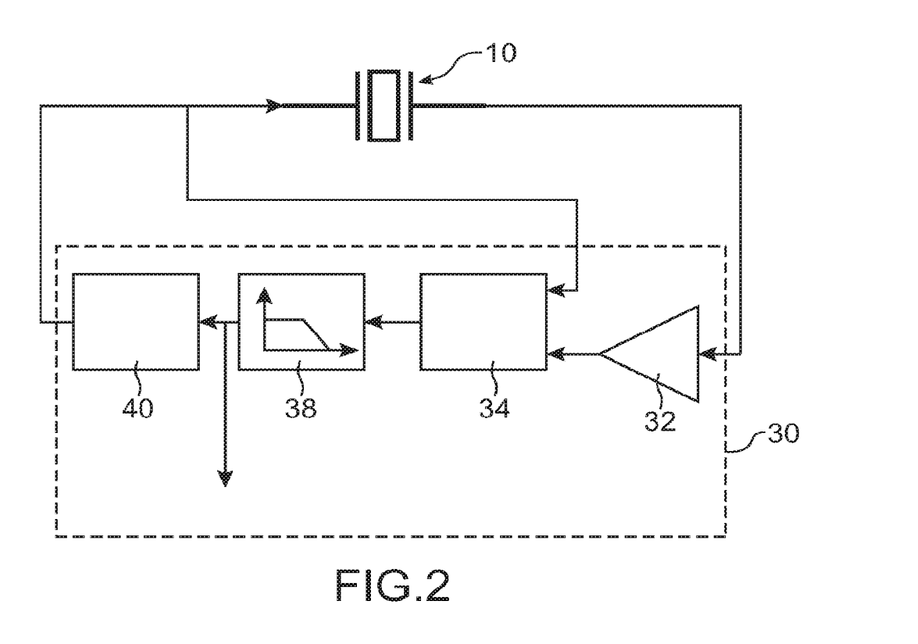
FIG. 2 shows a phase locked loop in which is arranged a resonator.

A first closed loop architecture shown in FIG. 2 consists of inserting the resonator 10 into a phase locked loop (PLL) which enslaves the phase of the resonator 10 to the value corresponding to its resonance. In such a PLL, an output signal of the resonator 10, which corresponds for example to the electric voltage measured at one of the ends 14, 16 of the beam 12, is sent to the input of a set of electronic elements 30 assuring the maintaining of the resonance of the resonator 10. These elements 30 comprise an amplifier 32 receiving at input the output signal of the resonator 10, a phase comparator 34 receiving on its inputs the signal applied at the input of the resonator 10 and the output signal of the amplifier 32, a low-pass filter 38 receiving at input the signal outputted by the phase comparator 34, and a voltage controlled oscillator 40 (VCO) receiving at input the output signal of the filter 38 and of which the output signal is applied to the input of the resonator 10. The resonance frequency of the resonator 10 is then monitored at the output signal of the filter 38.

Figure 3:
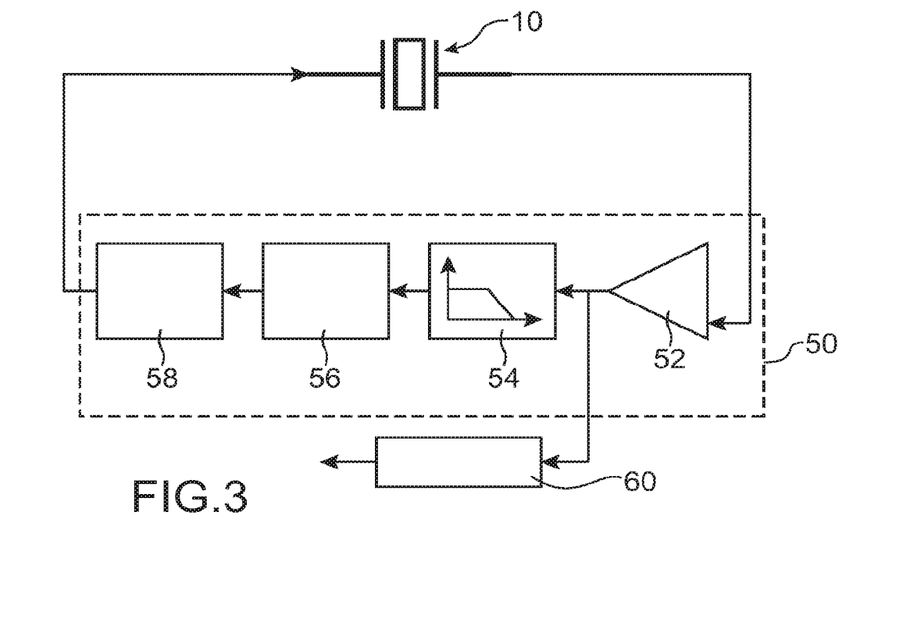
FIG. 3 shows a self-oscillating loop in which is arranged a resonator.

A second closed loop architecture consists of inserting the resonator 10 into a self-oscillating loop in which the resonator 10 is placed within an amplification chain 50 assuring the gain and phase shifting conditions required to make the resonator 10 resonate (Barkhausen criteria), as shown in FIG. 3. This chain 50 comprises an amplifier 52 receiving at input the output signal of the resonator 10, a low-pass filter 54 receiving at input the output signal of the amplifier 52, a phase shifter 56 carrying out a phase shifting of the signal outputted by the filter 54, and an amplitude limiter 58 limiting the amplitude of the signal outputted by the phase shifter 56 and of which the output signal is applied at input of the resonator 10. The resonance frequency of the resonator 10 is monitored at the output signal of the amplifier 52 by a frequency measurement device 60. In such a self-oscillating loop, the maintaining of the oscillation of the resonator 10 being assured, the detection is thus resumed in measuring the oscillation frequency using conventional methods such as the counting of periods, from a reference clock of frequency greater than that of the oscillation.

The main advantage of the self-oscillating loop architecture compared to a PLL is its compactness due to the absence of phase comparator and voltage-controlled oscillator.

The resonator 10 may resonate simultaneously according to several resonance modes of which the natural pulsations (or natural frequencies) depend on the conditions at the limits (embeddings) and the dimensions of the beam 12. In the example of FIG. 1, the first electrode 18 is able to excite the beam 12 in its first resonance mode, corresponding to the fundamental vibration frequency of the beam 12, whereas the second electrode 20, of which the dimension along the axis of the beam 12 is less than that of the first electrode 18, is able to excite the beam 12 in its first and second resonance modes.

For some applications, such as for example mass spectrometry, it is sought to monitor variations in resonance frequencies of the beam 12 when said beam is resonating in several resonance modes simultaneously. The two closed loop architectures described previously nevertheless do not make it possible to carry out such simultaneous monitoring of the shift of the multiple resonance frequencies of the resonator 10.

The document "Single-protein nanomechanical mass spectrometry in real time" of M. S. Hanay et al., Nature Nanotechnology 7, 602-608 (2012), describes a heterodyne architecture based on a double PLL locked onto two separate carriers. Such an architecture makes it possible to carry out a simultaneous reading of the two resonance modes of a resonator. Nevertheless, it is very bulky and incompatible with the production of an array of resonators for example for mass spectrometry applications.

DESCRIPTION OF THE INVENTION

Thus there is a need to propose a multimode oscillator making it possible to carry out simultaneous monitoring of resonance frequencies of a resonator resonating in several modes simultaneously and which is not very bulky and compatible with a realisation in array of several resonators.

To do so, one embodiment proposes a multimode oscillator comprising at least:
a resonator including:
  at least one moving element;
  actuating means, or actuators, able to make the moving element resonate according to at least two resonance modes of which one is symmetric and the other is antisymmetric;
  several elements for detecting, or detectors of, the displacement of the moving element each comprising at least one electrical parameter of which the value varies as a function of the displacement of the moving element and coupled to the moving element such that they induce, in at least the first and second output signals of the resonator representative of variations in said electrical parameter, phase differences, or initial phases differences, such that $\phi_{E1}-\phi_{O1}\neq\phi_{E2}-\phi_{O2}$, with $\phi_{E1}$ the phase of a first frequential component of the first output signal linked to a first of the resonance modes, $\phi_{O1}$ the phase of a first frequential component of the second output signal linked to the first of the resonance modes, $\phi_{E2}$ the phase of a second frequential component of the first output signal linked to a second of the resonance modes, and $\phi_{O2}$ the phase of a second frequential component of the second output signal linked to the second of the resonance modes;
polarization means, or polarization circuitry, able to apply to the detection elements, or to the detectors, electric polarization signals, continuous or alternating;
a first calculation device, or first calculator, able to carry out at least one first operation between the first and second output signals conserving the first frequential components of the first and second output signals and cancelling the second frequential components of the first and second output signals;
a second calculation device, or second calculator, able to carry out at least one second operation between the first and second output signals conserving the second frequential components of the first and second output signals and cancelling the first frequential components of the first and second output signals;
and in which the resonator and the first and second calculation devices, or calculators, form part of at least two self-oscillating loops able to make the oscillator, or more precisely the resonator, resonate simultaneously in the two resonance modes.

The first calculation device, of first calculator, belongs to a first of the two self-oscillating loops able to make the resonator resonate in a first of the two resonance modes, and the second calculation device, or second calculator, belongs to a second of the two self-oscillating loops able to make the resonator resonate in a second of the two resonance modes.

To carry out the simultaneous monitoring of the resonance frequencies of at least two symmetric and antisymmetric resonance modes of the resonator, which correspond advantageously to the first resonance mode (resonance according to the fundamental frequency) and to the second resonance mode (resonance according to the harmonic frequency 2) of the resonator, a multimode oscillator, advantageously bimodal, is proposed combining a particular polarization set up of the resonator with calculation devices, or calculators, making it possible to select the frequential components of the output signals corresponding to one or the other of the two resonance modes of the resonator.

The possibility of being able to conserve, at the output of each of the calculation devices or calculators, the frequential components of the output signals corresponding to one of the resonance modes and to cancel those corresponding to the other resonance mode is obtained both thanks to the particular coupling of the detection elements with the moving element of the resonator which induces a particular phase shift in the output signals, and thanks to the particular polarization signals applied to the detection elements. Furthermore, this is obtained without having need to resort to selective filtering to isolate the contribution of each of the resonance modes at the output of the device.

Due to the fact that the oscillator is formed of self-oscillating loops, it also has advantages of compactness linked to the absence of phase comparator and voltage-controlled oscillator, which makes it perfectly suited for use within a matrix architecture of such multimode oscillators.

The polarization means, or polarization circuitry, may be able to apply to the detection elements electric polarization signals which are continuous and of different values, e.g. of different signs and of identical amplitudes or not. In a variant, the polarization means, or polarization circuitry, may be able to apply to the detection elements alternating electric polarization signals, these alternating polarization signals being in this case phase shifted, or out of phase, with respect to each other.

The electrical polarization signals are such that they enable to obtain, in the first and second output signals of the resonator which are representative of the variations of said electrical parameter, phase differences, of initial phase differences, such that $\phi_{E1}-\phi_{O1}\neq\phi_{E2}-\phi_{O2}$.

The moving element may comprise a beam of which the two ends are built-in.

Advantageously, the polarization means, or polarization circuitry, may be such that the electrical polarization signals are continuous and of opposite values, or alternating and out of phase with respect to each other by a value equal to around 180°. In this case, the first operation is advantageously an addition and the second operation is advantageously a subtraction. This configuration is particularly advantageous because it makes it possible to discriminate simply the two resonance modes.

The actuating means, or actuators, may comprise an electrode able to apply to the moving element an electrostatic force making the moving element resonate according to the two resonance modes, or may comprise at least two electrodes each able to apply to the moving element an electrostatic force which favours making the moving element resonate according to one of the two resonance modes.

Each detection element, or detector, may comprise a piezoresistive strain gauge.

In this case, two first detection elements, or two first detectors, may form a first piezoresistive strain gauge bridge, two second detection elements, or two second detectors, may form a second piezoresistive strain gauge bridge, and the polarization means, or polarization circuitry, may be able to apply the electric polarization signals to the terminals of each of the first and second piezoresistive strain gauge bridges.

Each of the two self-oscillating loops may comprise at least one amplifier and a first phase shifter. These elements may serve to assure the verification of the Barkhausen criterion within each of the self-oscillating loops.

The polarization means, or polarization circuitry, may comprise at least:
  two generators of third and fourth alternating signals of different frequencies;

two second phase shifters each comprising an input connected to an output of one of the two generators and able to apply a same phase shift to the third and fourth alternating signals;

a first adder able to receive at input the fourth alternating signal not phase shifted and the third alternating signal phase shifted by one of the second phase shifters, and a second adder able to receive at input the third alternating signal not phase shifted and the fourth alternating signal phase shifted by the other of the second phase shifters, the signals intended to be outputted by the first and second adders corresponding to the electric polarization signals which are alternating and phase shifted with respect to each other.

The first phase shifters may each comprise an input connected to an output of one of the two generators and able to apply a different phase shift to each of the third and fourth alternating signals, and the multimode oscillator may comprise, in each of the two self-oscillating loops, a mixer of which a first input is connected to an output of one of the first and second calculation devices, or second calculators, and of which a second input is connected to an output of one of the first phase shifters.

The multimode oscillator may further comprise frequency measurement devices able to measure the frequencies of the first and second output signals.

Another embodiment relates to a detection device comprising a plurality of multimode oscillators as previously described, in which the resonators of the multimode oscillators form a detection array. The use of multimode oscillators for the design of a system comprising nanometric sensors makes it possible to end up with a robust system having a significant capture efficiency. The multimode oscillators are well suited to the design of large arrays of sensors with a view to high integration.

The polarization means, or polarization circuitry, may be common to all of the multimode oscillators and may be arranged beside the detection array, and/or at least a part of the elements of the self-oscillating loops of the multimode oscillators other than the resonators may be arranged under the detection array.

Groups of resonators may form macro-pixels of the detection array and at least a part of the elements of the self-oscillating loops of the multimode oscillators of each macro-pixel other than the resonators and/or the polarization means, or polarization circuitry, may be common to all of the multimode oscillators of said macro-pixel.

The detection device, or detector, is advantageously a mass spectrometer. In fact, the maintaining of a double oscillation on each of the resonators may be advantageously used to determine the mass and the position of a particle deposited on each of the resonators, as is described hereafter in the detailed description. In this case, the detection device, or detector, may comprise multimode oscillators including frequency measurement devices able to measure the frequencies of the first and second output signals, and may further comprise means of calculating, or a calculator of, a mass of particles and a position of deposition of the mass of particles on each resonator of the multimode oscillators from measurements of frequencies of the first and second output signals of each resonator.

The use of resonators within multimode oscillators to carry out measurements of very small masses, for example comprised between around $10^{-24}$ and $10^{-21}$ grammes, particularly in the field of gas analysis or mass spectrometry, is particularly advantageous.

BRIEF DESCRIPTION OF THE DRAWINGS

The present invention will be better understood on reading the description of embodiment examples given purely for indicative purposes and in no way limiting and by referring to the appended drawings in which.

Identical, similar or equivalent parts of the different figures described hereafter bear the same numerical references so as to make it easier to go from one figure to the next.

The different parts shown in the figures are not necessarily shown according to a uniform scale, in order to make the figures more legible.

The different possibilities (variants and embodiments) should be understood as not being mutually exclusive and may be combined together.

DETAILED DESCRIPTION OF PARTICULAR EMBODIMENTS

Firstly the properties of a resonator will be described, for example those of the resonator 10 described previously in relation with FIG. 1, which are going to make it possible to carry out simultaneous monitoring of the resonance frequencies of two different resonance modes of the resonator 10.

Each of the gauges 22, 24, 26, 28 of the resonator 10 may be considered as a resistance of which the value depends on the strain induced by the movement of the beam 12 thereon. When the beam 12 vibrates, the gauges 22, 24, 26, 28 are subjected to an alternation of compressive and extensive strains which differ according to the resonance mode(s) in which the beam 12 finds itself. Given the arrangement of the gauges 22, 24, 26, 28, these being located on the side of a same end of the beam 12 (gauges 22, 24 which are located on the side of the first end 14, and gauges 26, 28 which are located on the side of the second end 16) are subjected to opposite strains (one in compression and the other in extension).

It is possible that the resonator 10 comprises several beams 12 for example linked in parallel with respect to each other, i.e. having inputs linked one with each other and outputs linked one with each other. The beams form together a set of moving elements which can be considered as being one moving element.

Figure 4:
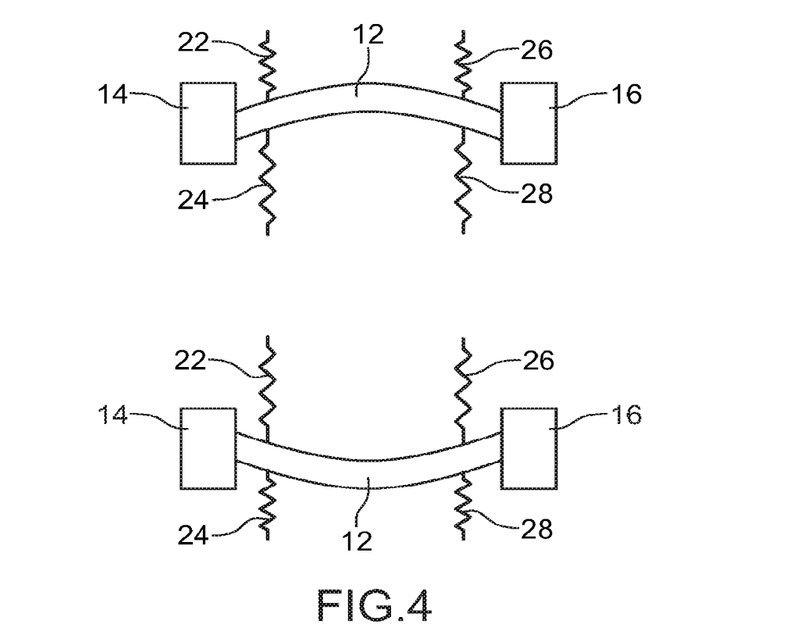
FIG. 4 schematically shows the extreme positions of the moving element of the resonator of FIG. 1 during a resonance according to the first resonance mode.
Figure 5:
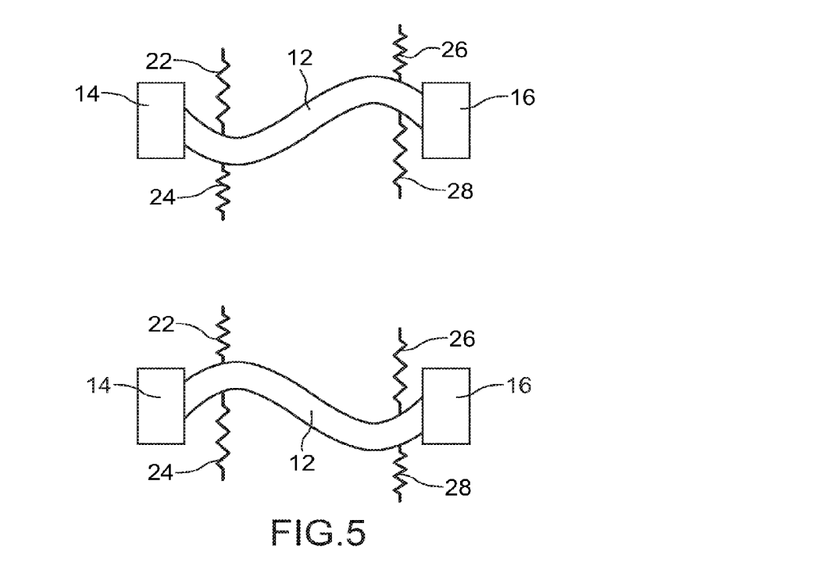
FIG. 5 schematically shows the extreme positions of the moving element of the resonator of FIG. 1 during a resonance according to the second resonance mode.

FIG. 4 schematically shows the beam 12 in two extreme positions during a vibration according to its first resonance mode (fundamental frequency), whereas FIG. 5 schematically shows the beam 12 in two extreme positions during a vibration according to its second resonance mode (harmonic frequency 2).

The strains applied to the gauges 22, 24, 26, 28 in the different resonance modes with natural frequency $f_n$ ($f_1$ for the first mode and $f_2$ for the second mode) are reflected in different resistance relative variations in the gauges which are noted $\delta R_{fn}(t)$ which is homogeneous to $\Delta R(t)/R$. Considering that the four gauges 22, 24, 26, 28 are similar (same value of resistance R in the absence of strain undergone by the gauge and, for a same movement of the beam 12, same relative variation $\delta R_{fn}(t)$ of the value of the resistance of the gauge), the resistances values of the gauges which are located at the two ends of the beam 12 and on the same side of the beam 12 (the gauges 22, 26 on the one hand, and the gauges 24, 28 on the other hand) vary in a similar manner for a resonance according to the first mode which is a symmetric resonance mode, and in an opposite manner for a vibration according to the second mode which is an antisymmetric resonance mode.

In the first position shown at the top of FIG. 4 and in which the gauges 22 and 26 are in compression and the gauges 24 and 28 are in extension, the gauges 22 and 26 each have a resistance equal to $R-R\cdot\delta R_{f1}(t)$, and the gauges 24 and 28 have a resistance equal to $R+R\cdot\delta R_{f1}(t)$. In the second position shown at the bottom of FIG. 4 and in which the gauges 22 and 26 are in extension and the gauges 24 and 28 are in compression, the gauges 22 and 26 have a resistance equal to $R+R\cdot\delta R_{f1}(t)$, and the gauges 24 and 28 have a resistance equal to $R-R\cdot\delta R_{f1}(t)$.

In the first position shown at the top of FIG. 5 and in which the gauges 22 and 28 are in extension and the gauges 24 and 26 are in compression, the gauges 22 and 28 have a resistance equal to $R+R\cdot\delta R_{f2}(t)$, and the gauges 24 and 26 have a resistance equal to $R-R\cdot\delta R_{f2}(t)$. In the second position shown at the bottom of FIG. 5 and in which the gauges 22 and 28 are in compression and the gauges 24 and 26 are in extension, the gauges 22 and 28 have a resistance equal to $R-R\cdot\delta R_{f2}(t)$, and the gauges 24 and 26 have a resistance equal to $R+R\cdot\delta R_{f2}(t)$.

Figure 6:
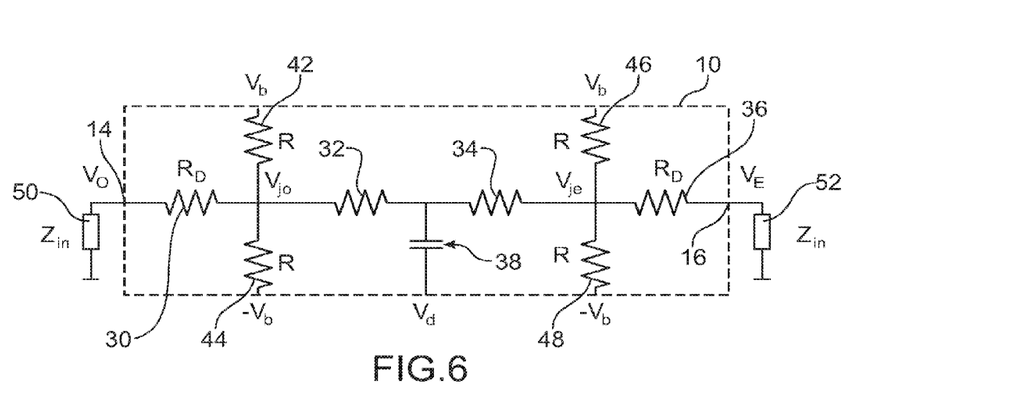
FIG. 6 shows an electrical modelling diagram of the resonator of FIG. 1.

The resonator 10 may be modelled electrically by the diagram of FIG. 6. The resistances 30, 32, 34 and 36 model different parts of the beam 12. The capacitance 38 models the electrodes 18, 20. Each of the resistances 42, 44, 46, 48 respectively models one of the gauges 22, 24, 26, 28. The impedances 50 and 52 represent the input impedances of the implemented elements of the resonator seen at the ends 14 and 16 of the beam 12.

The image of the mechanical resonance frequencies of the beam 12 is obtained by the relative variation in resistance $\delta R_{fn}(t)$ of the piezoresistive gauges. The polarization of the gauges by direct polarization voltages of opposite signs on each of the gauge bridges 22, 24 and 26, 28 (for example $+V_b$ applied to the gauges 22, 26 and $-V_b$ applied to the gauges 24, 28) makes it possible to generate within the resonator 10 an electric signal which can be used by the electronics associated with the resonator 10 to carry out the monitoring of variations in resonance frequencies. The voltages $V_O$ and $V_E$ correspond to the voltages measured respectively at the ends 14 and 16 of the beam 12, and the voltages $V_{jO}$ and $V_{jE}$ correspond to the voltages at the mid points of the gauge bridges, one of the bridges being formed by the gauges 22 and 24 and the other being formed by the gauges 26 and 28.

The gauges 22, 24, 26, 28 are coupled to the beam 12 such that they induce, in the output signals of the resonator 10 corresponding to the voltages $V_O$ and $V_E$, phase differences such that $\phi_{E1}-\phi_{O1} \neq \phi_{E2}-\phi_{O2}$, with $\phi_{E1}$ the phase of the frequential component of the voltage $V_E$ linked to the first resonance mode, $\phi_{O1}$ the phase of the frequential component of the voltage $V_O$ linked to the first resonance mode, $\phi_{E2}$ the phase of the frequential component of the voltage $V_E$ linked to the second resonance mode, and $\phi_{O2}$ the phase of the frequential component of the voltage $V_O$ linked to the second resonance mode. To obtain these phase differences, the continuous polarization voltages applied on each of the gauge bridges 22, 24 and 26, 28 have different values, and advantageously different signs. In the case of alternating polarization voltages, these voltages are phase shifted with respect to each other.

In the configuration where the polarization applied on either side of each of the gauge bridges corresponds to direct voltages of opposite signs or alternating voltages phase shifted by 180° on either side of the gauge bridge, the voltages $V_{jO}$ and $V_{jE}$ may be expressed according to the following equations:

$$V_{jE} = \frac{(1+\delta R_{fn}(t))V_b - (1-\delta R_{fn}(t))V_b}{2 + \frac{R}{Z_{in}+R_D}} \quad (1)$$

$$V_{jO} = \frac{(1+\delta R_{fn}(t))V_b - (1-\delta R_{fn}(t))V_b}{2 + \frac{R}{Z_{in}+R_D}} \quad (2)$$

with $R_D$ corresponding to the value of each of the resistances 30 and 36, and $Z_{in}$ corresponding to the value of each of the input impedances 50 and 52 of the associated electronics.

When the voltages $V_{jO}$ and $V_{jE}$ correspond to alternating voltages, they are then a function of time. The polarization voltage is expressed in this case by the following equation:

$$V_b(t) = \cos(2\pi f_{bn} t + \phi_{bn})$$

With $f_{bn}$ and $\phi_{bn}$ corresponding respectively to the frequency and to the phase of the polarization signal.

Moreover, the relative variation in resistance $\delta R_{fn}(t)$ is expressed according to the following equation:

$$\delta R_{fn}(t) = \frac{\Delta R}{R}\cos(2\pi f_n t + \phi_n)$$

Furthermore, $\delta R_{fn}(t) - 1$.

Considering that the current circulating in the beam 12 is zero, the voltages $V_O$ and $V_E$ may be expressed according to the following equations:

$$V_E = \frac{\delta R_{fn}(t)\cdot V_b}{1 + \frac{R}{2\cdot Z_{in}} + \frac{R_D}{Z_{in}}} \quad (3)$$

$$V_O = \frac{\delta R_{fn}(t)\cdot V_b}{1 + \frac{R}{2\cdot Z_{in}} + \frac{R_D}{Z_{in}}} \quad (4)$$

The voltages $V_E$ and $V_O$ expressed above are a function of time when alternating polarization voltages are used.

Furthermore, assuming that the input impedance values $Z_{in}$ of the associated electronics tend towards infinity:

$$V_O = V_b\cdot\delta R_{fn}(t) \quad (5)$$

$$V_E = V_b\cdot\delta R_{fn}(t) \quad (6)$$

Thus, due to the fact that the first resonance mode is symmetric and that the second resonance mode is antisymmetric, the voltages $V_O$ and $V_E$ in the two resonance modes may be expressed according to the following equations:

| Resonance mode | $V_E$ | $V_O$ |
| --- | --- | --- |
| Mode 1 | $V_b \cdot \delta R_{f1}(t)$ | $V_b \cdot \delta R_{f1}(t)$ |
| Mode 2 | $V_b \cdot \delta R_{f2}(t)$ | $-V_b \cdot \delta R_{f2}(t)$ |

The fact that for mode 2, the voltage $V_O$ is of opposite sign to that of the voltage $V_E$ stems from the fact that the relative variation in resistance induced by the second mode $\delta R_{f2}(t)$, between the first and the second gauge bridge is phase shifted by 180°.

Figure 7:
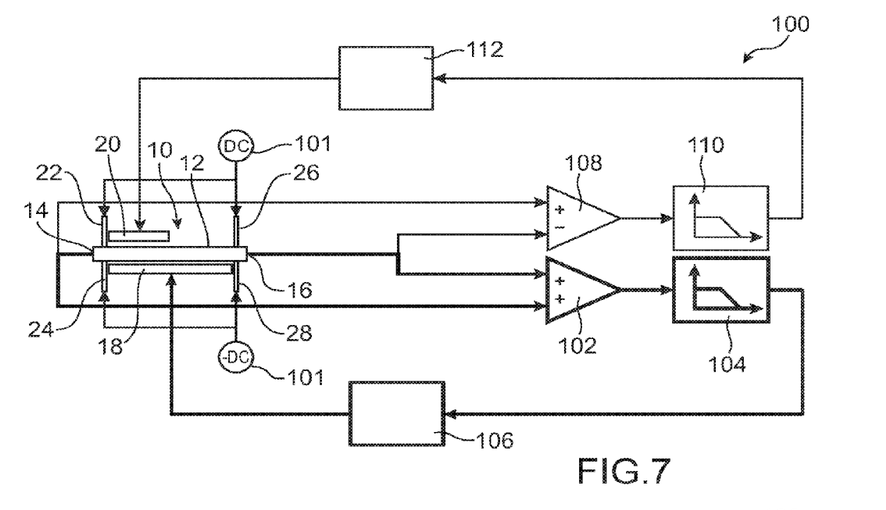
FIG. 7 shows a multimode oscillator according to a first embodiment.

To carry out the simultaneous monitoring of the resonance frequencies of two successive resonance modes of the resonator, a multimode oscillator 100 according to a first embodiment is described in relation with FIG. 7.

The oscillator 100 comprises a resonator 10 corresponding for example to the resonator 10 described previously in relation with FIGS. 1 and 4 to 6. A positive electric polarization potential (corresponding to the potential $V_b$ described previously in FIG. 4) is applied to the strain gauges 22 and 26. A negative electric polarization potential (corresponding to the potential $-V_b$ described previously in FIG. 4) is applied to the strain gauges 24 and 28. The electric potentials are generated by a voltage generator 101.

Periodic signals of different excitation frequencies are applied to the electrodes 18 and 20 and are such that the beam 12 resonates according to two different resonance modes such that one is symmetric (thus corresponding to one of the uneven modes) and that the other is antisymmetric (one of the even modes). Advantageously, these two resonance modes correspond to the two first resonance modes of the beam 12.

The device 100 comprises a first self-oscillating loop formed of a first amplifier 102, also called common mode amplifier, forming a summer and outputting an amplified signal corresponding to the sum of the electric potentials at the ends 14 and 16 of the beam 12. The output signal of the first amplifier 102 is applied to the input of a first low-pass filter 104 making it possible to eliminate the high frequency components of the output signal of the first amplifier 102, for example frequency components greater than around 1 MHz. The output signal of the first low-pass filter 104 is applied to the input of a first phase shifter 106 outputting the excitation signal applied to the electrode 18 which makes it possible to make the beam 12 resonate in its first resonance mode.

In this first self-oscillating loop, given that the potentials $V_O$ and $V_E$ at the ends 14 and 16 of the beam 12 both comprise the frequential component $V_b \cdot \delta R_{f1}(t)$ corresponding to mode 1 and that, for mode 2, the potential $V_E$ comprises the frequential component $-V_b \cdot \delta R_{f2}(t)$ and the potential $V_O$ comprises the frequential component $V_b \cdot \delta R_{f2}(t)$, the signal outputted of the first amplifier 102 is representative of the variation in the resonance frequency $f_1$ corresponding to mode 1 since the addition carried out makes it possible to conserve, in the spectrum of the output signal of the first amplifier 102, the frequential components concerning mode 1 ($V_E + V_O = 2 \cdot V_b \cdot \delta R_{f1}(t)$ for mode 1), and to eliminate the frequential components of mode 2 ($V_E + V_O = -V_b \cdot \delta R_{f2}(t) + V_b \cdot \delta R_{f2}(t) = 0$ for mode 2).

The first amplifier 102 and the first phase shifter 106 present in the first self-oscillating loop are such that they make it possible to guarantee the oscillation of the resonator 10 in the first resonance mode, that is to say assure that the total phase shifting between the input of the resonator 10 and its output, and the return to the input of the resonator 10 via the elements of the first self-oscillating loop, that is to say for a complete turn of the loop, is a whole number multiple of 360°, and that the gain in the first self-oscillating loop is equal to 1 (Barkhausen stability criterion).

The device 100 also comprises a second self-oscillating loop formed of a second amplifier 108, called differential amplifier, outputting an amplified signal corresponding to the difference of the electric potentials at the ends 14 and 16 of the beam 12. The output signal of the second amplifier 108 is applied to the input of a second low-pass filter 110, for example similar to the first low-pass filter 104 making it possible to eliminate the high frequency components of the output signal of the second amplifier 108. The output signal of the second low-pass filter 110 is applied to the input of a second phase shifter 112 outputting the excitation signal applied to the electrode 20 which makes it possible to make the beam 12 resonate in its second resonance mode.

In this second self-oscillating loop, given that the potentials $V_O$ and $V_E$ at the ends 14 and 16 both comprise the frequential component $V_b \cdot \delta R_{f1}(t)$ corresponding to mode 1 and that, for mode 2, the potential $V_E$ comprises the frequential component $-V_b \cdot \delta R_{f2}(t)$ and the potential $V_O$ comprises the frequential component $V_b \cdot \delta R_{f2}(t)$, the signal outputted of the second amplifier 108 is representative of the variation in the resonance frequency $f_2$ corresponding to mode 2 since the subtraction carried out makes it possible to conserve, in the spectrum of the output signal of the second amplifier 108, the frequential components concerning mode 2 ($V_O - V_E = -2 \cdot V_b \cdot \delta R_{f2}(t)$ for mode 2), and to eliminate the frequential components of mode 1 ($V_O - V_E = V_b \cdot \delta R_{f1}(t) - V_b \cdot \delta R_{f1}(t) = 0$ for mode 1).

The second amplifier 108 and the second phase shifter 112 present in the second self-oscillating loop are such that they make it possible to guarantee the oscillation of the resonator 10 in the second resonance mode, that is to say assure that the total phase shift between the input of the resonator 10 and its output, and the return to the input of the resonator 10 via the elements of the second self-oscillating loop is a whole number multiple of 360°, and that the gain in the second self-oscillating loop is equal to 1.

Thus, the oscillator 100 judiciously uses the fact that one or more of the resonance modes of the resonator 10 are symmetric (case of mode 1) and that one or more other resonance modes of the resonator 10 are antisymmetric (case of mode 2). Thus, the differential reading carried out in the second loop of the oscillator 100 by the second amplifier 108 makes it possible to eliminate the frequential components relative to the symmetric resonance mode(s) and to conserve only those relative to the antisymmetric resonance mode(s). Conversely, the sum made in the first loop of the device 100 by the first amplifier 102 makes it possible to eliminate the frequential components relative to the antisymmetric resonance mode(s) and to conserve only those relative to the symmetric resonance mode(s).

In a variant of the configuration described previously in relation with FIG. 7, it is possible that the electric polarization potentials are inversed compared to those described previously, that is to say to have for example the positive potential applied to the gauges 24 and 28 and the negative potential applied to the gauges 22 and 26.

According to another variant, it is possible that the electric polarization potentials are inversed compared to those described previously uniquely for one of the two gauge bridges, that is to say to have for example the positive potential applied to the gauges 24 and 26 and the negative potential applied to the gauges 22 and 28, or instead have the positive potential applied to the gauges 22 and 28 and the negative potential applied to the gauges 24 and 26. In this variant, the differential reading carried out in the second loop of the oscillator 100 by the second amplifier 108 makes it possible to eliminate the frequential components relative to antisymmetric resonance mode(s) and to conserve only those relative to symmetric resonance mode(s). The output signal outputted by the second amplifier 108 thus only comprises for example the frequential components relative to resonance mode 1 and not those of resonance mode 2. The sum carried out in the first loop of the oscillator 100 by the first amplifier 102 makes it possible to eliminate the frequential components relative to symmetric resonance mode(s) and to conserve only those relative to antisymmetric resonance mode(s). The output signal outputted by the second amplifier 108 thus only comprises the frequential components relative to mode 2 and not those of mode 1.

The oscillator 100 according to this first embodiment forms a homodyne double self-oscillating loop in which the resonance frequencies of the resonator 10 impose the oscillation frequencies of the signal all along the path of the signal in this re-looped system.

In a variant of the first embodiment described previously, it is possible that the resonating device 100 does not comprise one or the two low-pass filters 104, 110, for example when the output signals of one or the two amplifiers 102, 108 does not comprise high frequency components perturbing the oscillation of the resonator, due to the fact that this or these amplifiers have a sufficient filtering effect toward these high frequency components.

In a variant of this first embodiment, it is also possible that, in one or each of the self-oscillating loops, the element carrying out the operation between the output signals of the resonator 10 and that carrying out the amplification of the signal corresponding to the result of the operation carried out are two separate elements.

Figure 8:
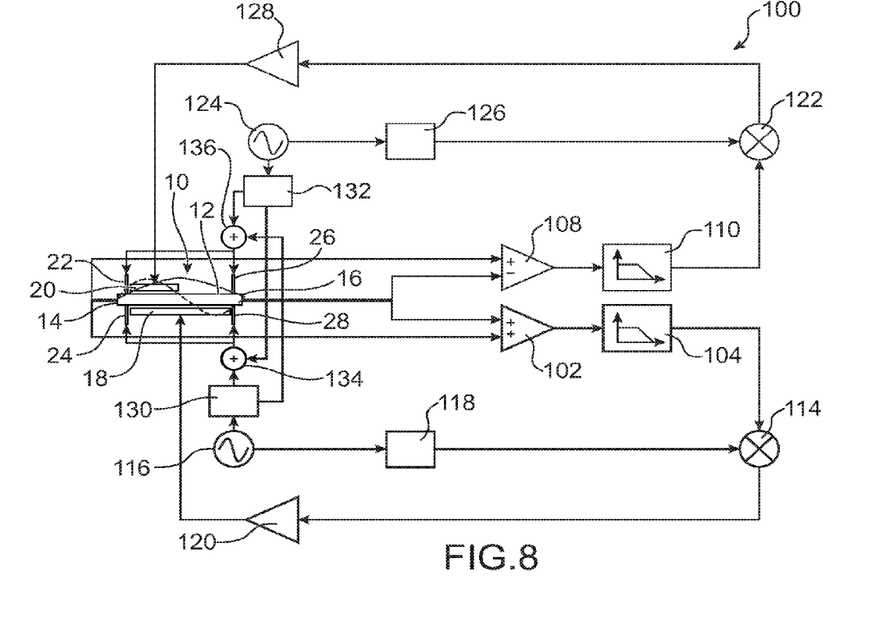
FIG. 8 shows a multimode oscillator according to a second embodiment.

A multimode oscillator 100 according to a second embodiment is described in relation with FIG. 8.

As in the first embodiment, the oscillator 100 comprises the resonator 10 coupled to two self-oscillating loops. A first of the two loops comprises, as in the first embodiment, the first amplifier 102 able to make the sum of the potentials $V_O$ and $V_E$ at the ends 14 and 16 of the beam 12. The output of the first amplifier 102 is connected to the input of the first low-pass filter 104. The output of the first low-pass filter 104 is connected to a first input of a first mixer 114. A first generator 116 generates a first periodic signal, for example sinusoidal, and comprises its output connected to the input of a first phase shifter 118 of which the output is connected to a second input of the first mixer 114. The output of the first mixer 114 is connected to the input of a third amplifier 120 which outputs the control signal of the electrode 18 of the resonator 10.

The second self-oscillating loop comprises the second amplifier 108 outputting a signal corresponding to the difference $V_O-V_E$, and the second low-pass filter 110, as in the first embodiment. The other elements of the second self-oscillating loop are analogous to those of the first loop, that is to say correspond to a second mixer 122 of which an input is connected to the output of the second low-pass filter 110, a second generator 124 outputting a second periodic signal, for example sinusoidal, of different frequency to that outputted by the first generator 116 and applied to the input of a second phase shifter 126 of which the output is connected to a second input of the second mixer 122, and a fourth amplifier 128 of which the input is connected to the output of the second mixer 122 and which outputs the control signal of the electrode 20 of the resonator 10.

Each of the signals outputted by the generators 116, 124 is also phase shifted by 180° by phase shifters 130 and 132. A first adder 134 makes the sum of the first periodic signal phase shifted by 180° and of the second periodic signal not phase shifted. The output signal of the first adder 134 is applied to the strain gauges 24 and 28. A second adder 136 makes the sum of the first periodic signal not phase shifted and of the second periodic signal phase shifted by 180°. The polarization signals may be applied according to the different configurations described previously for the first embodiment.

In this second embodiment, the frequency tuning in each of the loops is assured by the mixers 114 and 122. The phase tuning in the loops is assured by the phase shifters 118, 126 combined with the mixers 114, 122. The oscillators 116 and 124 each output a signal of frequency ωb1 and ωb2 respectively. The signals applied to the electrodes 18 and 20 are periodic signals particularly comprising frequency components ωr1 (for the signal applied to the electrode 18) and ωr2 (for the signal applied to the electrode 20). The signals obtained at the output of the low-pass filters 104 and 108 have respectively frequencies Δω1=ωb1−ωr1 and Δω2=ωb2−ωr2. The output potentials $V_O$ and $V_E$ each comprise the frequency components Δω1 and Δω2.

The polarization signals are here of multiple frequencies, i.e. having two components of frequencies ωb1 and ωb2, and for each frequency component, the phase shifting is predetermined, that is contact. For alternating polarization signals, a constant phase shifting is here obtained with periodic signals with different frequencies which are multiple with respect to each other.

In this second embodiment, the polarization means, or polarization circuitry, of the resonator 10 also serve to lower the frequency of the output signals of the resonator 10. In this so-called heterodyne configuration, the output signals of the resonator 10 are at different frequencies (lower) than those used for making resonate, that is to say those of the signals applied to the electrodes 18, 20. In order to make self-oscillating loops, the signals at the output of the low-pass filters 104 and 110 are suited to frequencies adequate to make the beam 12 resonate.

As in the first embodiment, the oscillator 100 according to this second embodiment judiciously uses the fact that the resonance modes of the resonator 10 may be either symmetric (case of mode 1) or antisymmetric (case of mode 2). The differential reading carried out in the second loop of the device 100 by the second amplifier 108 makes it possible to eliminate the frequential components relative to symmetric resonance modes and to conserve only those relative to antisymmetric resonance modes. Conversely, the sum made in the first loop of the device 100 by the first amplifier 102 makes it possible to eliminate the frequential components relative to antisymmetric resonance modes and to conserve only those relative to symmetric resonance modes.

In the example described above the alternating polarization voltages comprise a phase shift of 180° with respect to each other. The selection of the frequential components of the symmetric or antisymmetric modes is thus obtained by carrying out operations corresponding to an addition and to a subtraction. In a variant, this phase shift may be different to 180°. In this case, the discrimination between the symmetric and antisymmetric resonance modes is obtained by carrying out operations other than an addition and a subtraction, these operations being a function of the value of this phase shift.

In a variant of the second embodiment described previously, it is possible that the oscillator 100 does not comprise the low-pass filters 104, 110, as described previously for the first embodiment. Furthermore, it is also possible that one or the two amplifiers 120, 128 arranged between the outputs of the mixers 114, 122 and the electrodes 18, 20 are not present if the gain within one or more self-oscillating loops is sufficient so that the resonator 10 enters into resonance in the two modes.

In a variant, it is also possible that, in one or each of the self-oscillating loops, the element carrying out the operation between the output signals of the resonator 10 and that carrying out the amplification of the signal corresponding to the result of the operation carried out are two separate elements.

In the example of the resonator 10 described previously, two electrodes 18, 20 are used to make the beam 12 resonate in the two resonance modes. In a variant, the resonator of the oscillator 100 may comprise a single electrode able to make the beam 12 resonate in the two desired resonance modes by applying to this single electrode two signals of different excitation frequency. In the example of the resonator 10 shown in FIG. 1, this single electrode would correspond to the second electrode 20.

Furthermore, in the example described previously, the resonator 10 comprises four strain gauges. In a variant, it is possible that the resonator 10 comprises only two strain gauges, each arranged on the side of a different end of the beam 12. These two strain gauges may be arranged at two opposite sides or not of the beam 12. By analogy with the example of the resonator 10 shown in FIG. 1, these two strain gauges would correspond to the gauges 22 and 28, or instead to the gauges 24 and 26, or to the gauges 22 and 26, or even to the gauges 24 and 28.

The resonance properties of the resonator 10 according to at least two separate resonance modes and the possibility of the oscillator 100 of monitoring variations in resonance frequencies of the resonator 10 according to these resonance modes may be advantageously used within the framework of mass spectrometry. In fact, a shift of the resonance frequency of a resonator induced by the presence of particles, advantageously neutral particles, or instead electrically charged particles or ionised molecules, at the surface of the resonator depends both on its mass and its absorption position on the resonator. The measurement of the shift of the resonance frequency of at least two resonance modes, one symmetric and the other antisymmetric, and advantageously two successive resonance modes such that modes 1 and 2 of a resonator having symmetric limit conditions thus makes it possible to determine the mass and the position of the particles deposited on the resonator.

Thus, noting $f_n$ the natural resonance frequencies of the resonator 10 in the resonance modes considered (for example noted $f_1$ and $f_2$ for modes 1 and 2), Am the mass deposited on the surface of the beam 12, $M_{eff_n}$ the effective mass of the beam 12 for mode n, £f the relative frequency variation and $\phi_n(x)$ the wave shape of the mode n calculated at the position x of the mass (position of the mass on the beam 12 along the axis parallel to its length, that is to say the X axis in the example of FIG. 1), the following relation is then verified for each of the resonance frequencies $f_n$ of the resonator:

$$\Delta m \approx \frac{\Delta f \cdot \Phi_n(x_0)}{f_n \cdot 2 \cdot M_{eff_n}} \qquad (7)$$

with $x_O$ corresponding to the position of the mass deposited on the beam 12.

The equation (7) above posed for two different frequencies $f_n$ (two resonance modes) makes it possible to determine the mass and the position of the particles deposited on the doubly built-in resonator.

Thus, oscillators 100 as described previously are advantageously used within a mass spectrometer comprising an array of pixels, each pixel comprising a coupled resonator in an oscillator 100 as described previously and enabling monitoring of the shift of at least two resonance frequencies of the resonator of each oscillator 100. The mass spectrometer also comprises calculation means, or a calculator, making it possible to deduce, from the equation (7) applied to the two measured variations in resonance frequency, the position x of the mass deposited and finally the mass Am deposited on each of the resonators of the oscillators 100.

In such a mass spectrometer, a large number of resonators of nanometric dimensions are organised in a network to form the array of pixels. Within the array of pixels, several oscillators 100 may form macro-pixels in which some elements may be pooled.

Thus, when the oscillators 100 are such as the oscillator 100 according to the first embodiment described previously, the polarization means, or polarization circuitry, of the resonator 10 applying the potentials $+V_b$ and $-V_b$ to the strain gauges 22, 24, 26 and 28 may be common to all of the oscillators 100 of a same macro-pixel, or even all the oscillators 100 of the array of pixels of the mass spectrometer.

Furthermore, the amplifiers 102, 108, the low-pass filters 104, 110 and the phase shifters 106, 112 may be common to several oscillators 100 of a same macro-pixel. These elements are in this case connected successively to the resonators 10 of the oscillators 100 of the macro-pixel in order to address successively the oscillators 100 of the macro-pixel.

When the oscillators 100 correspond to devices such as the oscillator 100 according to the second embodiment described previously, the polarization means, or polarization circuitry, of the resonator 10, that is to say the generators 116, 124 and the phase shifters 118, 126, 130, 132, may be common to all of the oscillators 100 of a same macro-pixel or even to all of the oscillators 100 of the array of pixels. The amplifiers 102, 108, the filters 104, 110, the mixers 114, 122 and the amplifiers 120, 128 may be common to all of the oscillators 100 of the macro-pixel.

Figure 9:
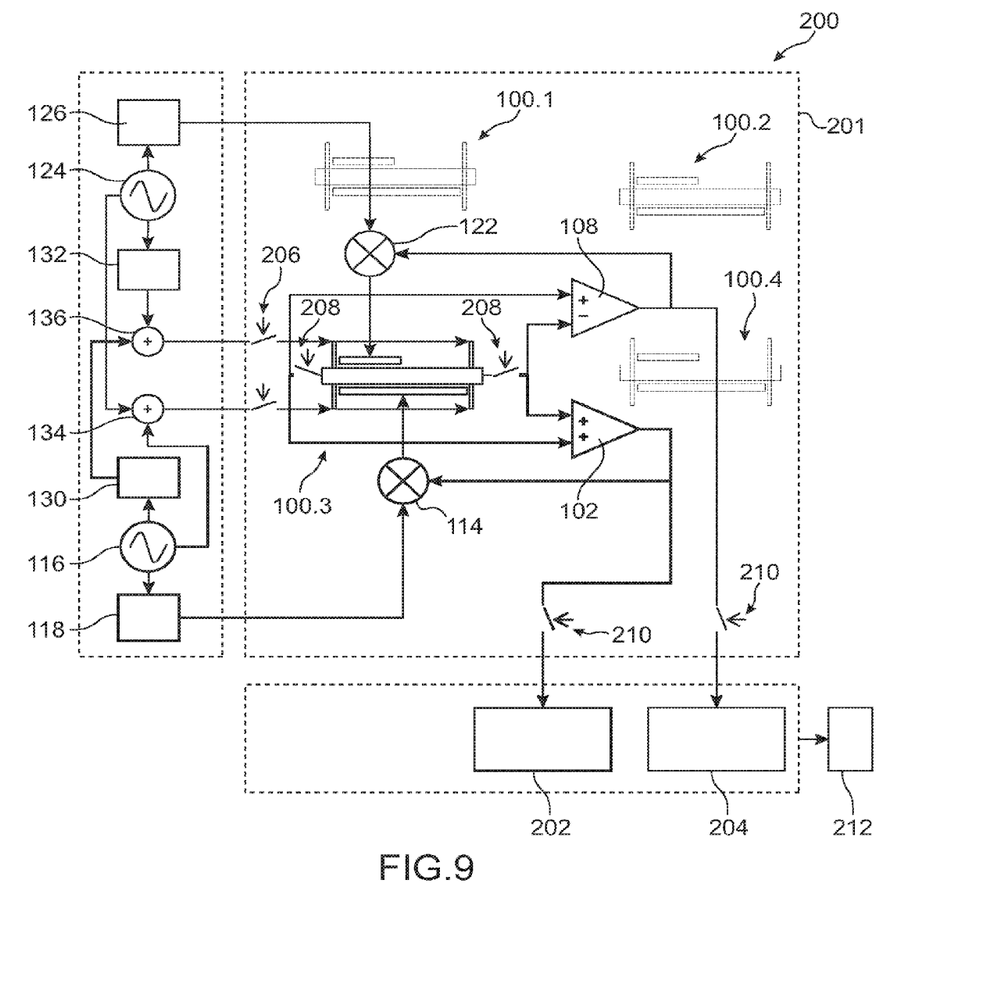
FIG. 9 shows a macro-pixel of a detection device according to an example of embodiment.

FIG. 9 shows an example of embodiment of such a macro-pixel 201 of a detection device 200 corresponding to a mass spectrometer. The macro-pixel 201 is here formed of four pixels. Each of the four pixels is formed by a multimode oscillator, referenced 100.1 to 100.4 in FIG. 9. The polarization means, or polarization circuitry, of the four oscillators 100.1-100.4 are here common to these four oscillators 100.1-100.4 (and potentially also common to the other macro-pixels of the device 200) and correspond to the polarization means, or polarization circuitry, of the oscillator 100 described previously in relation with FIG. 8, that is to say are formed of the two generators 116, 124 of alternating signals of different frequencies, phase shifters 118, 126, 130 and 132 and adders 134, 136 described previously and arranged at the end of line of the macro-pixel 201.

In the example of FIG. 9, the polarization means, or polarization circuitry, are connected permanently to all of the resonators present in the macro-pixel 201, which makes it possible to minimise the number of switches present in the macro-pixel 201. In a variant, it is possible to have switches successively connecting the polarization means, or polarization circuitry, to the different resonators of the macro-pixel 201. Thus the polarization circuitry is successively connected to each of the resonators 100.1, 100.2, 100.3 and 100.4 in order to select the pixel which is active within the macro-pixel 201. In addition, the two outputs of each of the resonators 100.1, 100.2, 100.3 and 100.4 are connected at the input of the two oscillating loops of the macro-pixel. The outputs of the two oscillating loops are permanently connected to the four resonators of the macro-pixel. In an alternative, it is possible to have the polarization means, or polarization circuitry, permanently connected to the four resonators 100.1, 100.2, 100.3 and 100.4 in order to minimize the numbers of switches in the macro-pixel 201.

Each pixel comprises its own resonator 10. The macro-pixel 201 comprises two amplifiers 102, 108 and two mixers 114, 122 which are common to the oscillators 100.1-100.4 of the macro-pixel 201. First switches 206 make it possible to connect the polarization means, or polarization circuitry, successively to the resonator 10 of each of the oscillators 100.1-100.4. Second switches 208 make it possible to connect the ends of the beam of the resonator of each of the oscillators 100.1-100.4 successively to the inputs of the amplifiers 102, 108. In a variant, it would be possible that each oscillator 100.1-100.4 comprises two amplifiers and two mixers specific to each oscillator.

Unlike the oscillator 100 shown in FIG. 8, the oscillators 100.1-100.4 here do not comprise the low-pass filters 104, 110 or the amplifiers 120, 128.

The macro-pixel 201 also comprises two frequency measurement devices 202, 204 making it possible to measure simultaneously frequency variations in one of the resonators 10 in the two resonance modes. Third switches 210 make it possible to couple the devices 202, 204 successively to each of the oscillators 100.1-100.4. The detector 200 further comprises means 212 of calculating, or calculator of, a mass of particles and a position of deposition of the mass of particles on each resonator 10 of the oscillators from frequency measurements of the first and second output signals of each resonator 10.

This very compact design of the pixels of a mass spectrometer makes it possible to form an array comprising a large number of oscillators.

In such a mass spectrometer 200, the fact that the polarization means, or polarization circuitry, are not common to all of the macro-pixels of the array but to a part only of the macro-pixels of the array makes it possible to do away with dispersions within the array of pixels.

The architecture of the macro-pixel 201 shown in FIG. 9 particularly makes it possible to increase the fill factor of the resonators while at the same time providing space on the semi-conductor substrate serving for the realisation of the associated electronics. This architecture makes it possible to increase the time available for the reading of variations in the resonance frequencies of a resonator.

Although in FIG. 9 the resonators of each of the oscillators 100.1-100.4 are shown in a same plane as the electronic elements forming the self-oscillating loops of the oscillators, the resonators of the oscillators 100.1-100.4 are in fact hybridised above these electronic elements.

In the configuration shown in FIG. 9, each oscillator 100.1-100.4 is connected to oscillation means, or oscillator, through switches 206, 208 during a restricted time interval. For a surface S occupied by the electronic elements, the number of pixels included in a macro-pixel may correspond to the maximum number of resonator which can be arranged in this surface S.

The invention claimed is:
1. A multimode oscillator comprising at least:
 a resonator including:
  at least one moving element
  actuators able to make the moving element resonate according to at least two resonance modes of which one is symmetric and the other is antisymmetric;
  several detectors of the displacement of the moving element each comprising at least one electrical parameter of which the value varies as a function of the displacement of the moving element and coupled to the moving element such that they induce, in at least first and second output signals of the resonator representative of the variations in said electrical parameter, phase differences such that $\phi_{E1} - \phi_{O1} \neq \phi_{E2} - \phi_{O2}$, with $\phi_{E1}$ the phase of a first frequential component of the first output signal linked to a first of the resonance modes, $\phi_{O1}$ the phase of a first frequential component of the second output signal linked to the first of the resonance modes, $\phi_{E2}$ the phase of a second frequential component of the first output signal linked to a second of the resonance modes, and $\phi_{O2}$ the phase of a second frequential component of the second output signal linked to the second of the resonance modes;
 polarization circuitry able to apply to the detectors electric polarization signals;
 a first calculator able to carry out at least one first operation between the first and second output signals conserving the first frequential components of the first and second output signals and cancelling the second frequential components of the first and second output signals;
 a second calculator able to carry out at least one second operation between the first and second output signals conserving the second frequential components of the first and second output signals and cancelling the first frequential components of the first and second output signals;
 and in which the resonator and the first and second calculators form part of at least two self-oscillating loops able to make the resonator resonate simultaneously in the two resonance modes.

2. The multimode oscillator according to claim 1, in which the moving element comprises a beam of which the two ends are built-in.

3. The multimode oscillator according to claim 1, in which the polarization circuitry is such that the electric polarization signals are continuous and of different values, or alternating and out of phase with respect to each other.

4. The multimode oscillator according to claim 3, in which the first operation is an addition and the second operation is a subtraction.

5. The multimode oscillator according to claim 1, in which the actuators comprise an electrode able to apply to the moving element an electrostatic force making the moving element resonate according to the two resonance modes, or comprise at least two electrodes each able to apply to the moving element an electrostatic force favouring making the moving element resonate according to one of the two resonance modes.

6. The multimode oscillator according to claim 1, in which each detector comprises a piezoresistive strain gauge.

7. The multimode oscillator according to claim 6, in which:
 two first detectors form a first piezoresistive strain gauge bridge;

two second detectors form a second piezoresistive strain gauge bridge; and the polarization circuitry is able to apply the electric polarization signals to the terminals of each of the first and second piezoresistive strain gauge bridges.

8. The multimode oscillator according to claim 1, in which each of the two self-oscillating loops comprises at least one amplifier and one first phase shifter.

9. The multimode oscillator according to claim 8, in which the polarization circuitry comprises at least:

two generators of third and fourth alternating signals of different frequencies;

two second phase shifters each comprising an input connected to an output of one of the two generators and able to apply a same phase shift to the third and fourth alternating signals;

a first adder able to receive at input the fourth alternating signal not phase shifted and the third alternating signal phase shifted by one of the second phase shifters, and a second adder able to receive at input the third alternating signal not phase shifted and the fourth alternating signal phase shifted by the other of the second phase shifters, the signals intended to be outputted by the first and second adders corresponding to the electric polarization signals which are alternating and phase shifted with respect to each other.

10. The multimode oscillator according to claim 9, in which the first phase shifters each comprise an input connected to an output of one of the two generators and able to apply a different phase shift to each of the third and fourth alternating signals, and further comprising, in each of the two self-oscillating loops, a mixer of which a first input is connected to an output of one of the first and second calculators and of which a second input is connected to an output of one of the first phase shifters.

11. The multimode oscillator according to claim 1, further comprising frequency measurement devices able to measure the frequencies of the first and second output signals.

12. A detection device comprising a plurality of multimode oscillators according to claim 1, in which the resonators of the multimode oscillators form a detection array.

13. The detection device according to claim 12, in which the polarization circuitry is common to all of the multimode oscillators and is arranged beside the detection array, and/or in which at least a part of the elements of the self-oscillating loops of the multimode oscillators other than the resonators are arranged under the detection array.

14. The detection device according to claim 12, in which groups of resonators form macro-pixels of the detection array, and at least a part of the elements of the self-oscillating loops of the multimode oscillators of each macro-pixel other than the resonators and/or the polarization circuitry are common to all of the multimode oscillators of said macro-pixel.

15. The detection device according to claim 12, comprising multimode oscillators each further comprising frequency measurement devices able to measure the frequencies of the first and second output signals, and in which said detector is a mass spectrometer and further comprises a calculator of a mass of particles and a position of deposition of the mass of particles on each resonator of the multimode oscillators from frequency measurements of the first and second output signals of each resonator.

\* \* \* \* \*